(12) United States Patent
Ward et al.

(10) Patent No.: US 8,386,230 B2
(45) Date of Patent: Feb. 26, 2013

(54) CIRCUIT DESIGN OPTIMIZATION

(75) Inventors: Samuel I. Ward, Austin, TX (US);
Kevin F. Reick, Round Rock, TX (US);
Bryan J. Robbins, Poughkeepsie, NY (US); Thomas E. Rosser, Austin, TX (US); Robert J. Shadowen, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 251 days.

(21) Appl. No.: 12/858,562

(22) Filed: Aug. 18, 2010

(65) Prior Publication Data
US 2012/0046921 A1 Feb. 23, 2012

(51) Int. Cl.
*G06F 17/50* (2006.01)
(52) U.S. Cl. .................................................. 703/15
(58) Field of Classification Search .................. 703/15
See application file for complete search history.

(56) References Cited

U.S. PATENT DOCUMENTS

| 6,996,792 | B2 | 2/2006 | Pie et al. |
| 7,249,330 | B2 | 7/2007 | Roesner et al. |
| 7,370,308 | B2 | 5/2008 | Pie et al. |

FOREIGN PATENT DOCUMENTS

CN 101187958 5/2008

OTHER PUBLICATIONS

Saxena, N.; Scalable Solutions to Specification and Verification of Large Designs, 1999, one page—abstract.
Hentzchke, RF. et al.; Improving Run Times by Pruned Application of Synthesis Transforms, 2005, pp. 38-43.
Rao, RR. et al.; Soft Error Reduction in Combinational Logic Using Gate Resizing and Flipflop Selection, 2006, pp. 502-509.
Roy, JA. et al.; EPIC: Ending Piracy of Integrated Circuits, 2008, pp. 1069-1074.

*Primary Examiner* — Hugh Jones
(74) *Attorney, Agent, or Firm* — Patrick E. Caldwell, Esq.; The Caldwell Firm, LLC

(57) ABSTRACT

A method includes generating a first behavioral model of a circuit, the first behavioral model describing a physical circuit in a first configuration. The first configuration comprises a first logic structure configured to generate a first intermediate signal based on a received first plurality of inputs. The first configuration further comprises a logic cone configured to generate a scan output based on the first intermediate signal and a plurality of scan inputs. The first behavioral model is modified to generate a second behavioral model describing the physical circuit in a second configuration. The second configuration comprises an error circuit configured to receive the scan output and the first intermediate signal. A testability model is generated based on the second behavioral model, the testability model comprising a first structural representation of the first logic structure. In the event the first logic structure causes a coverage problem, the testability model is modified to include an inversion structure. The inversion structure is configured based on the first logic structure. The inversion structure is configured to generate an inversion structure output. The testability model is modified to couple the inversion structure output as an input to the error circuit.

24 Claims, 5 Drawing Sheets

180
CIRCUIT DESIGN OPTIMIZATION

TECHNICAL FIELD

The present invention relates generally to the field of automated electronic circuit design, and, more particularly, to circuit design optimization.

BACKGROUND

Modern electronic devices are often made up of large numbers of sub-components such as latches and gates, embodied in transistors, which frequently number in the millions. In some cases, the functional design of an electrical or electronic device includes electrical paths that converge in a logic structure into a single output. This is especially true for devices in early stages of the development cycle, before optimization and refinement of the design.

Modern very large scale integrated circuit (VLSI) systems typically include various components included to ensure robust designs. For example, design engineers typically include design for test (DFT) mechanisms in modern VLSI designs. DFT mechanisms typically support a variety of testing and verification tools.

For example, one of the most common testing methods is stuck-at-fault (SAF) testing. Broadly, SAF testing seeks to identify logic and/or electrical faults in the design that cause stuck-at faults. Generally, stuck-at faults are faults that cause a node and/or output to remain in a constant state, instead of varying according to the inputs of the upstream logic. That is, instead of producing a "1" or a "0", based on the desired behavior, a stuck-at fault produces only a "1" or a "0", regardless of the desired behavior. The logic value at that node is 'stuck" either high (stuck-at-one (sa1)) or low (stuck-at-zero (sa0)).

SAF testing, as well as many other types of testing, frequently uses test patterns that are intended for a particular circuit design and/or to test for one or more particular conditions. Generally, the test system applies the test pattern(s) as an input to the circuit under test and compares the circuit output with a known good result. Because the number of possible test required can be very large, on the order of $2^n$ possible input combinations, typical systems use random test pattern generators to generate the input test patters for a particular design.

In most cases, these randomly-generated test patterns are effective for identifying many types of faults. For many faults, a randomly-generated test pattern yields the required inputs to cover the majority of operational conditions and expected input combinations. However, there are certain situations where a randomly generated test patter does not yield all of the desired input combinations. For example, there are certain structures, such as large AND or OR trees where there is a very low probability that test pattern generator will produce a suitable input pattern required to test a particular SAF for that AND/OR tree. These SAFs are often referred to as "random pattern resistant" faults.

In many cases, random pattern resistant faults require the design engineer to rework the behavioral and/or structural layout of a design. However, the hardware description language (HDL) representation of the entire design tends to change frequently, especially in the earlier stages of development. As such, even if the designer does eliminate the random pattern resistant fault, the effort may be wasted when a design revision changes the HDL representation such that what was once an optimal overall solution is no longer optimal. Moreover, the design engineer may not be aware of the fault until after synthesis of the design.

That is, in typical systems, one a design was through the synthesis step in the design process, the design engineer would run a 'fault coverage' reporting tool on the design. If the tool identifies random pattern resistant faults, the design engineer must either manually correct the physical design, or, more frequently, modify the HDL to improve testability with the design. Once modified, the design engineer still had to apply synthesis and other testing tools to look for faults caused or revealed by the correction. These reiterations add costly delay and expense into the design process.

BRIEF SUMMARY

The following summary is provided to facilitate an understanding of some of the innovative features unique to the embodiments disclosed and is not intended to be a full description. A full appreciation of the various aspects of the embodiments can be gained by taking into consideration the entire specification, claims, drawings, and abstract as a whole.

A method includes generating a first behavioral model of a circuit, the first behavioral model describing a physical circuit in a first configuration. The first configuration comprises a first logic structure configured to generate a first intermediate signal based on a received first plurality of inputs. The first configuration further comprises a logic cone configured to generate a scan output based on the first intermediate signal and a plurality of scan inputs. The first behavioral model is modified to generate a second behavioral model describing the physical circuit in a second configuration. The second configuration comprises an error circuit configured to receive the scan output and the first intermediate signal. A testability model is generated based on the second behavioral model, the testability model comprising a first structural representation of the first logic structure. In the event the first logic structure causes a coverage problem, the testability model is modified to include an inversion structure. The inversion structure is configured based on the first logic structure. The inversion structure is configured to generate an inversion structure output. The testability model is modified to couple the inversion structure output as an input to the error circuit.

A computer program product for circuit design includes a computer readable storage medium having computer readable program code embodied therewith. The computer readable program code comprises computer readable program code configured to generate a first behavioral model of a circuit, the first behavioral model describing a physical circuit in a first configuration. The first configuration comprises a first logic structure, the first logic structure configured to receive a first plurality of inputs, the first logic structure further configured to generate a first intermediate signal based on the first plurality of inputs. The first configuration further comprises a logic cone configured to receive the first intermediate signal, to receive a plurality of scan inputs, and to generate a scan output based on the first intermediate signal and the plurality of scan inputs. The computer readable program code also includes computer readable program code configured to modify the first behavioral model to generate a second behavioral model, the second behavioral model describing the physical circuit in a second configuration. The second configuration comprises an error circuit configured to receive the scan output and the first intermediate signal. The computer readable program code also includes computer readable program code configured to generate a testability model based on the second behavioral model, the testability model comprising a first structural representation, based on the first logic structure. The computer readable program code also includes computer readable program code configured to determine, based on the testability model, whether the first logic structure causes a first coverage problem. The computer readable program code also includes computer readable program code configured to, in the event the first logic structure causes a first coverage problem, modify the testability model to include an inversion structure, based on the first logic structure. The inversion structure is configured to generate an inversion structure output. The computer readable program code also includes computer readable program code configured to modify the testability model to couple the inversion structure output as an input to the error circuit, to generate a modified testability model.

A system includes a user interface configured to receive user input from a user. A generation module is configured to generate a first behavioral model of a circuit, based on received user input, the first behavioral model describing a physical circuit in a first configuration. The first configuration comprises a first logic structure, the first logic structure configured to receive a first plurality of inputs, the first logic structure further configured to generate a first intermediate signal based on the first plurality of inputs. The first configuration further comprises a logic cone configured to receive the first intermediate signal, to receive a plurality of scan inputs, and to generate a scan output based on the first intermediate signal and the plurality of scan inputs. A module editor is configured to modify the first behavioral model to generate a second behavioral model, the second behavioral model describing the physical circuit in a second configuration. The second configuration comprises an error circuit configured to receive the scan output and the first intermediate signal. A synthesis module is configured to generate a testability model based on the second behavioral model, the testability model comprising a first structural representation, based on the first logic structure. A test module is configured to determine, based on the testability model, whether the first logic structure causes a first coverage problem. The synthesis module is further configured to, in the event the first logic structure causes a first coverage problem: modify the testability model to include an inversion structure based on the first logic structure, the inversion structure being configured to generate an inversion structure output; and to modify the testability model to couple the inversion structure output as an input to the error circuit, to generate a modified testability model.

BRIEF DESCRIPTION OF THE SEVERAL VIEWS OF THE DRAWINGS

The accompanying figures, in which like reference numerals refer to identical or functionally-similar elements throughout the separate views and which are incorporated in and form a part of the specification, further illustrate the embodiments and, together with the detailed description, serve to explain the embodiments disclosed herein.

DETAILED DESCRIPTION

Figure 1:
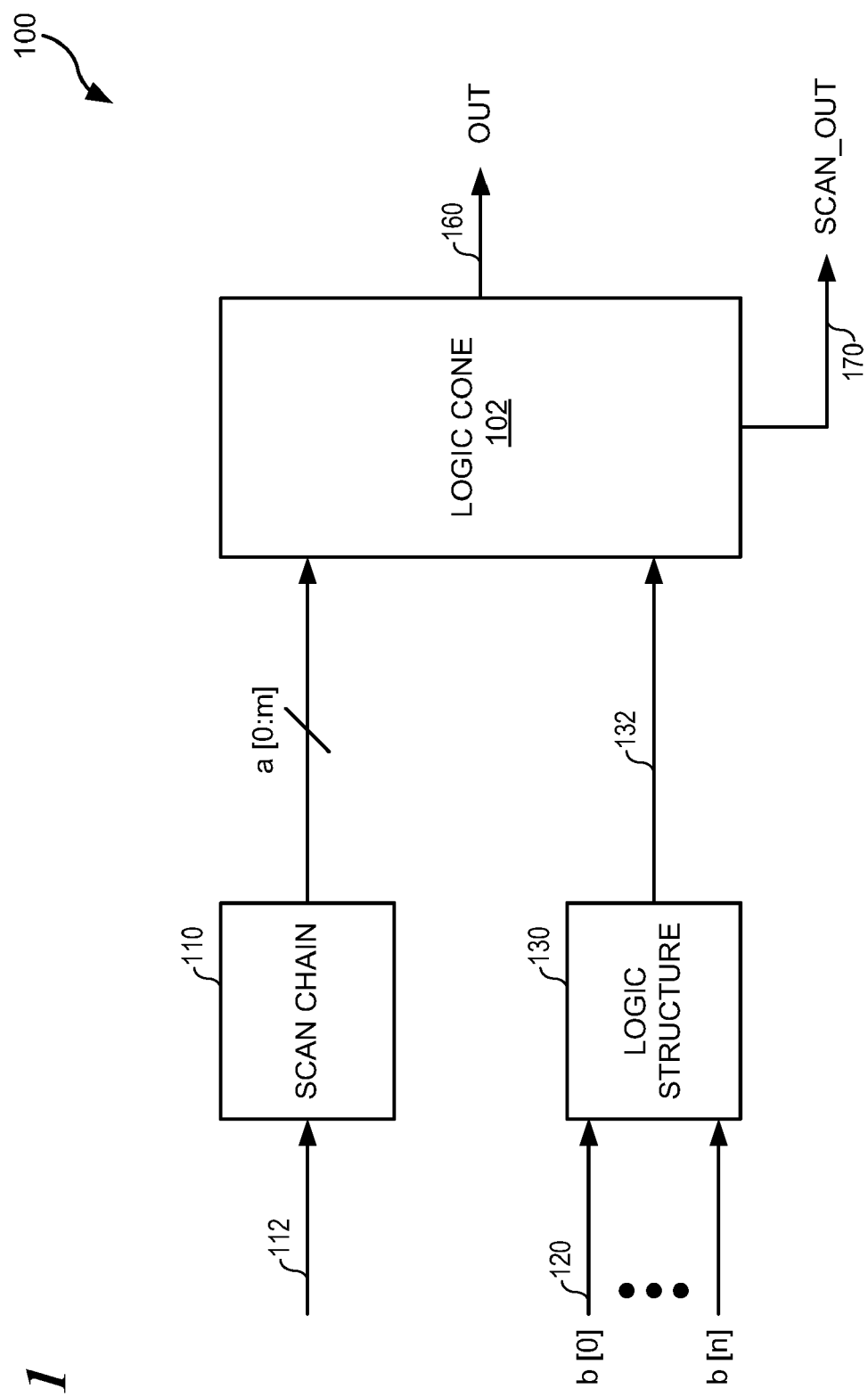
FIG. 1 illustrates a high-level block diagram showing an electronic circuit in accordance with one embodiment of the disclosure.

The particular values and configurations discussed in these non-limiting examples can be varied and are cited merely to illustrate at least one embodiment and are not intended to limit the scope of the invention.

In the following discussion, numerous specific details are set forth to provide a thorough understanding of the present invention. Those skilled in the art will appreciate that the present invention may be practiced without such specific details. In other instances, well-known elements have been illustrated in schematic or block diagram form in order not to obscure the present invention in unnecessary detail. Additionally, for the most part, details concerning network communications, electro-magnetic signaling techniques, user interface or input/output techniques, and the like, have been omitted inasmuch as such details are not considered necessary to obtain a complete understanding of the present invention, and are considered to be within the understanding of persons of ordinary skill in the relevant art.

As will be appreciated by one skilled in the art, the present invention may be embodied as a system, method, or computer program product. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module," or "system." Furthermore, the present invention may take the form of a computer program product embodied in one or more computer readable medium (s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions.

These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Referring now to the drawings, FIG. 1 is a high-level circuit diagram illustrating an exemplary circuit 100, in a particular stage in the design process, in accordance with a preferred embodiment of the present invention. In one embodiment, circuit 100 is embodied as part of a larger integrated circuit (IC) chip.

Generally, as used herein, a "chip" is a physical object. This is the physical object that is the result of the fabrication process. Broadly, the ultimate goal of circuit design is to produce a chip that operates according to the desired performance specifications.

As used herein, a "layout" is an abstracted representation of the physical properties of a chip, especially the location, measurements, and connections between physical features of the chip. Broadly, a "layout" indicates the relative placement and features of devices on the chip, including connectors running between devices. The layout is frequently in the form of a "printed circuit board" (PCB) layout. Generally, fabrication systems use the layout, or a derivative thereof, such as a lithography photomask pattern, to manufacture the chip.

Layouts can sometimes be difficult to modify for optimal performance, especially early in the design process. Instead, design engineers use more abstract representations of the chip to work up early designs. There are a number of tools designed to manipulate and test these abstract representations to ensure that a design works as expected (a process sometimes called "verification") and to identify performance characteristics of the design.

There are two general forms of these abstract representations: structural representations and behavioral representations. As used herein, a "structural representation" or "structural model" is an abstracted representation of the various devices and structures of a chip, such as logic gates, connectors, and transistors, for example. Where a layout typically includes precise relative positioning between connected devices, a structural representation typically indicates only that the devices are connected and not, for example, where those devices are located on a PCB. In some cases, a structural representation may include some information about the connection between devices, such as wire length and width/depth, to facilitate electrical testing of the design. Generally, as used herein, "analysis" of a structural representation produces a behavioral representation.

As used herein, a "behavioral representation" or "behavioral model" is an abstracted representation of the various functions embodied on the chip, such as processors, adders, memory arrays, and AND/OR gates, for example. Where the structural representation typically describes the devices on the chip, the behavioral representation describes the functions those devices perform. As such, the behavioral representation can be implemented in a number of different structural representations, each of which has attendant benefits and drawbacks. The art of circuit design includes implementing the desired behavior in a layout that best achieves the performance objectives of the chip, particularly in terms of power consumption, cost-effectiveness, and time-to-market.

Generally, as used herein, "synthesis" of a behavioral representation produces a structural representation. Broadly, the design engineer manipulates both structural and behavioral representations over the course of design development, verification, and testing. The boundary between a purely structural model and a purely behavioral model is sometimes unclear. For example, a design engineer may wish to impose restraints on the structures implemented to embody a particular behavioral feature. As such, a typical behavioral model often includes certain specified structures or structural features. During synthesis, the synthesis module employs specified structures where defined and uses either library modules or ad hoc implementations where the structures are not specified. The resultant structural model is therefore a combination of user-defined structures and structures selected though the automated optimization processes of the synthesis tool.

One skilled in the art will understand that there is a tradeoff in automation efficiency between specifying structures in a behavioral model and taking advantage of the optimization opportunities that abstraction to a behavioral model provides. Generally, however, a Verilog or VHDL representation of a design, for example, is a behavioral model. Similarly, a Cadence or PDSRTL representation, for example, is a structural model. The embodiments disclosed herein offer significant advantages that improve the design process in a number of ways, as described in more detail below.

The various embodiments are described herein with respect to the design development of exemplary circuit 100. One skilled in the art will appreciate that the various embodiments can be configured to improve the design process of any kind of circuit, electronic device, or chip. In the illustrated embodiment, circuit 100 includes a logic cone 102 coupled to receive input from two illustrated sources. One skilled in the art will understand that a logic cone 102 can be configured to receive any number of input sources, depending on the objectives of the design.

In the illustrated embodiment, one input source into input cone 102 is a scan chain represented by scan chain 110. Generally, scan chain 110 is an otherwise conventional scan chain, configured to receive input 112 and to generate scan input a[0:m] into logic cone 102. pair of latches, latch A 110 and latch B 130. Logic cone 102 is an otherwise convention logic cone, modified as described herein. That is, in one embodiment, logic cone 102 includes downstream logic that receives data and scan input from latch A 110 and latch B 130. One skilled in the art will recognize this configuration as a common configuration frequently used in IC design.

Similarly, in the illustrated embodiment, another input source into logic cone 102 is a logic structure 130. Logic structure 130 is a circuit configured to receive inputs 120 (b[0] to b[n]), to perform one or more logic functions on received inputs, and to generate an output 132 based on received inputs. As shown, output 132 is an input into logic cone 102. One skilled in the art will understand that logic structure 130 and scan chain 110 are generalizations included to illustrate the disclosed embodiments and, therefore, should not be considered limiting.

As shown in the illustrated embodiment, logic cone 102 receives the above described signals from logic structure 130 and scan chain 110. Based on the received signals, logic cone 102 generates a LOGIC_OUT signal 160 and a SCAN_OUT signal 170. One skilled in the art will understand that, generally, test patterns are often applied to a particular circuit as scan chain inputs.

In the illustrated embodiment, output 132 also illustrates a node susceptible to random pattern resistant faults. Specifically, in one embodiment, logic structure 130 is configured such that there is a low probability that a typical random test pattern generator will produce a test pattern with the particular combination of inputs 120 required to test output 132 for stuck-at faults. One skilled in the art will understand that, generally, this configuration is an unintended consequence of the particular objective logic structure 130 was designed to achieve. As such, as described in more detail below, the disclosed embodiments can be configured to identify one or more logic structures 130 that are potential "coverage problem" components. As used herein, a "coverage problem" is an attribute of a logic structure 130 that indicates that one or more DFT test patterns may not work as intended when applied to logic structure 130 during testing.

Identifying coverage problems is a typical step in most testing and verification processes. However, as described above, resolving identified coverage problems is problematic for typical systems. As described in more detail below, the embodiments disclosed herein modify circuit 100 to improve testability. One skilled in the art will understand that testability improvements are often measured with respect to several abstraction levels, including the IC chip as a whole. As such, as used herein, to "improve testability" means to manipulate the configuration of a circuit design, whether in behavioral model, structural model, layout, or other format, in furtherance of improving one or more testability metrics.

Figure 2:
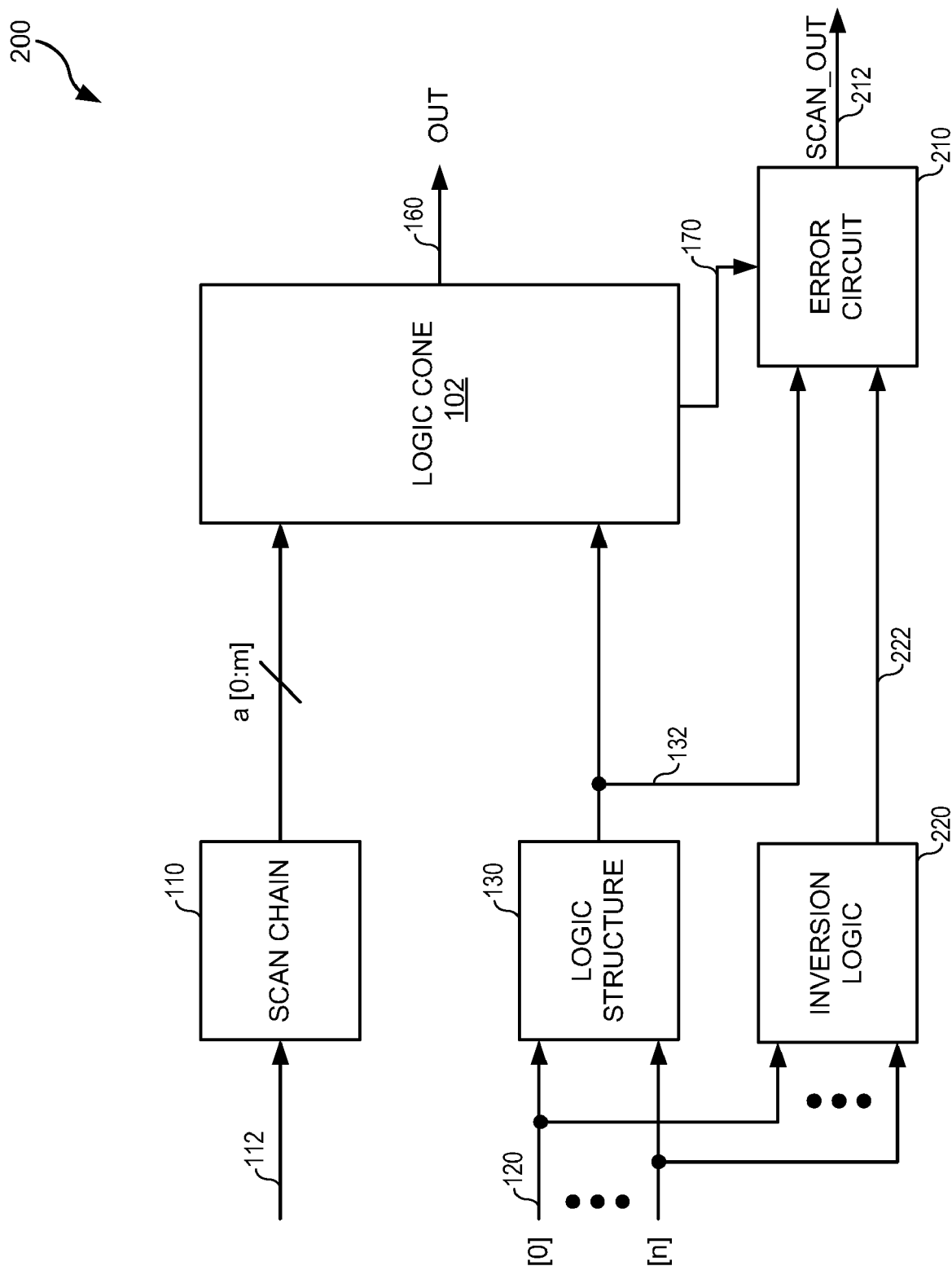
FIG. 2 illustrates a high-level block diagram showing an electronic circuit in accordance with one embodiment of the disclosure.

FIG. 2 illustrates one such modification to improve testability. Specifically, FIG. 2A is a high-level circuit diagram illustrating a circuit 200. In the illustrated embodiment, circuit 200 is a modification of circuit 100 of FIG. 1. As shown in the illustrated embodiment, circuit 200 includes an error circuit 210.

In one embodiment, error circuit 210 is a latch. Generally, as described in more detail below, error circuit 210 is configured to receive scan and other data and to generate an output scan signal useful in fault testing. In the final form, after additional modifications described in more detail below, error circuit 210 couples to various components of circuit 200.

In the illustrated embodiment, error circuit 210 receives input from three sources. Specifically, in the illustrated embodiment, error circuit 210 receives scan output signal 170 from logic cone 102, output signal 132 from logic structure 130 and inversion logic output 222 from inversion logic 220, as described in more detail below.

Specifically, in the illustrated embodiment, the synthesis tool has added error circuit 210 and inversion logic 220, and coupled the additional components as shown. Generally, inversion logic 220 is a circuit implementing a function that evaluates to a particular value, given the inputs b[0:n]. The synthesis tool selects the value to which the inversion logic function evaluates based on the particular coverage problem the inversion logic 220 experiences.

In one embodiment, inversion logic 220 functionally evaluates to the same output as logic structure 130 (given the same inputs), but is configured with a physical implementation different from logic structure 130. In one embodiment, error circuit 210 tests whether the outputs of logic structure 130 and inversion logic 220 are equal. In one embodiment, if the outputs of logic structure 130 and inversion logic 220 are not equal, error circuit 210 captures and reports an error.

Similarly, in one embodiment, inversion logic 220 functionally evaluates to the inverted output of logic structure 130 (given the same inputs), and is therefore configured with a physical implementation different from logic structure 130. In one embodiment, error circuit 210 tests whether the outputs of logic structure 130 and inversion logic 220 are equal. In one embodiment, if the output of logic structure 130 and inversion logic 220 are equal, error circuit 210 captures and reports an error.

In one embodiment, generally, logic structure 130 is a subset of a larger logic cone in which the output 132 of logic structure 130 is difficult to test using random pattern generators. As described above, in one embodiment, the system adds inversion logic 220 that is functionally equivalent and is easier to test with a random pattern. In this case, "easier to test" means that a random pattern generator will generate a suitable test pattern for inversion logic 220 a higher percentage of the time than the random pattern generator will generate a suitable test pattern for logic structure 130. Accordingly, a design engineer can use a test pattern generator to provide test patterns for inversion logic 220 that achieve the desired fault coverage. As described above, if the outputs 132 and 222 are not equal (or are equal where inversion logic 220 produces the inverse of output 132 using), then the system reports a fault. As such, the disclosed embodiments provide improved test coverage without requiring the design engineer to generate full coverage patterns for logic structure 130.

Thus, as shown in the illustrated embodiment, circuit 200 is configured to resolve identified coverage problems. As described in more detail below, the disclosed embodiments resolve identified coverage problems without cost-ineffective involvement of the design engineer and/or extensive reconfiguration of the HDL, behavioral model, and/or structural models.

Figure 3:
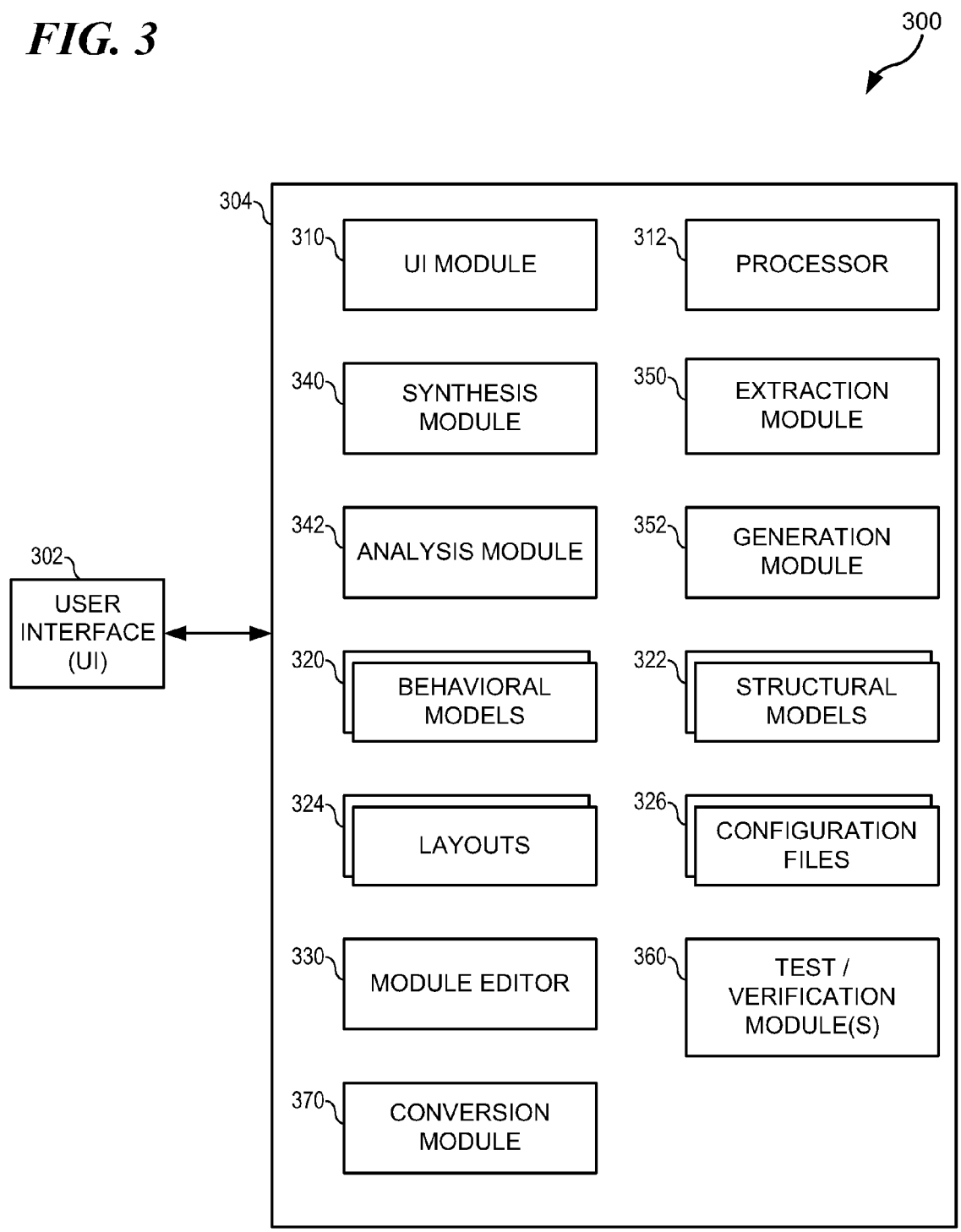
FIG. 3 illustrates a block diagram of a circuit design system in accordance with one embodiment of the disclosure.

FIG. 3 illustrates a high-level block diagram of a system 300, in accordance with one embodiment. Specifically, system 300 includes a user interface 302 coupled to a design system 304. User interface 302 is an otherwise conventional user interface (UI). For example, UI 302 can be configured as a workstation, a graphical UI (GUI), a command line interface, or other suitable interface. In one embodiment, design system 304 is a collection of components together configured to perform circuit design optimization as described herein. In one embodiment, design system 304 is a computer system configured as described herein.

In the illustrated embodiment, design system 304 includes UI module 310. Generally, UI module 310 is configured to interact with UI 302 and, in one embodiment, serves as a bridge between UI 302 and design system 304. In the illustrated embodiment, design system 304 also includes a processor 312. Generally, processor 312 is an otherwise conventional processor.

In the illustrated embodiment, design system 304 includes a plurality of behavioral models 320. Generally, behavioral models 320 are behavioral representations or models, as described above. In the illustrated embodiment, design system 304 includes a plurality of structural models 322. Generally, structural models 322 are structural representations or models, as described above.

In the illustrated embodiment, design system 304 includes a plurality of layouts 324. Generally, layouts 324 are layouts as described above. In the illustrated embodiment, design system 304 includes a plurality of configuration files 326. Generally, configuration files 326 are configuration files as described above.

In the illustrated embodiment, design system 304 includes module editor 330. Generally, module editor 330 is configured to receive user input and to manipulate and/or modify models and configuration files based on user input. For example, in one embodiment, module editor 330 is configured to manipulate and modify behavioral models 320, structural models 322, and configuration files 326. Broadly, in one embodiment, module editor 330 serves as a mechanism by which the design engineer can make manual changes to the behavioral and structural models and the configuration files, as described above.

In the illustrated embodiment, design system 304 also includes synthesis module 340 and analysis module 342. In one embodiment, synthesis module 340 is an otherwise conventional synthesis tool, tools, or suite of tools, modified as described herein. As described above, in one embodiment, synthesis module 340 is configured to generate a structural model 322 based on an input behavioral model 320 and, in one embodiment, a configuration file 326. Similarly, in one embodiment, analysis module 342 is an otherwise conventional "analysis" tool, tools, or suite of tools, modified as described herein. As described above, in one embodiment, analysis module 442 is configured to generate a behavioral model 322 based on an input structural model 322 and, in one embodiment, a configuration file 326.

Similarly, in the illustrated embodiment, design system 304 also includes extraction module 350 and generation module 352. In one embodiment, extraction module 350 is an otherwise convention extraction tool, tools, or suite of tools, modified as described herein. As described above, in one embodiment, extraction module 350 is configured to generate a structural module 322 based on an input layout 324 and, in one embodiment, a configuration file 326. Similarly, in one embodiment, generation module 352 is an otherwise conventional layout generation tool, tools, or suite of tools, modified as described herein. As described above, in one embodiment, generation module 352 is configured to generate a layout 324 based on an input structural model 322 and, in one embodiment, a configuration file 326.

In the illustrated embodiment, design system 304 includes a test/verification module(s) 360. Generally, module 460 is configured to provide one or more test and/or verification processes for one or more behavioral or structural models and/or layouts. One skilled in the art will understand that there many useful test and verification tools applicable to circuit design in every stage of development.

In the illustrated embodiment, design system 304 includes a conversion module 370. Generally, in one embodiment, conversion module 370 is configured to convert a layout 324 into a format usable by a fabrication system to manufacture a physical chip based on the design represented by layout 324. One skilled in the art will understand that there are many steps to manufacture a chip based on an underlying layout 324. For example, in one embodiment, conversion module 370 is configured to generate one or more lithography photomasks based on layout 324.

Thus, system 300 can be configured to implement the disclosed embodiments as described herein. More particularly, system 300 can be configured to implement the processes as described below with respect to FIGS. 4 and 5.

Figure 4:
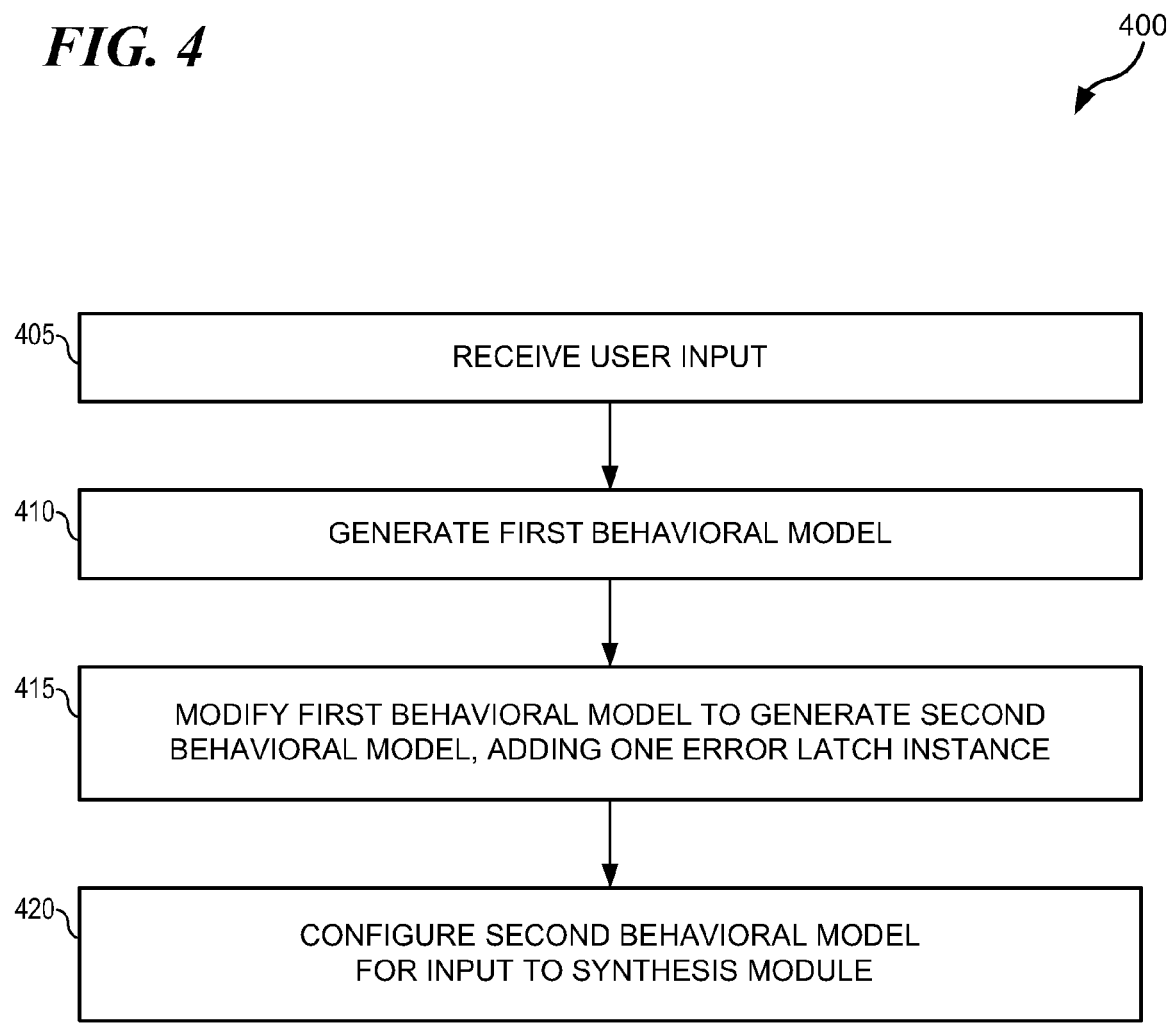
FIG. 4 illustrates a high-level flow diagram depicting logical operational steps of a circuit design method, which can be implemented in accordance with one embodiment of the disclosure.

FIG. 4 illustrates one embodiment of a method for circuit design optimization. Specifically, FIG. 4 illustrates a high-level flow chart 400 that depicts logical operational steps performed by, for example, system 300 of FIG. 3, which may be implemented in accordance with a preferred embodiment. Generally, design system 304 performs the steps of the method, unless indicated otherwise.

As indicated at block 405, the process begins, wherein design system 304 receives user input from a user. Generally, design system 304 receives an irregular stream of user input, including modifications to one or more files or models, instructions to save a design state, and other common instructions. One skilled in the art will understand that even automated design techniques require a substantial amount of user input and guidance.

Next, as indicated at block 410, system 304 generates a first behavioral model based on user input. In one embodiment, user input includes text input providing HDL code. In another embodiment, user input includes input produced by a design tool in response to user input.

Next, as indicated at block 415, system 304 modifies the first behavioral model to generate a second behavioral model. In one embodiment, system 304 adds an error latch instance to each clock domain for which system 304 expects to find, or intends to search for, coverage problems.

Next, as indicated at block 420, system 304 and/or the design engineer configures the second behavioral model for input to a synthesis module. In one embodiment, the tools the design engineer uses to modify the behavioral model are configured to save the models/files in a suitable configuration automatically. In another embodiment, the design engineer and/or system 304 configure the models/file as appropriate for the desired synthesis tool and the process ends.

Figure 5:
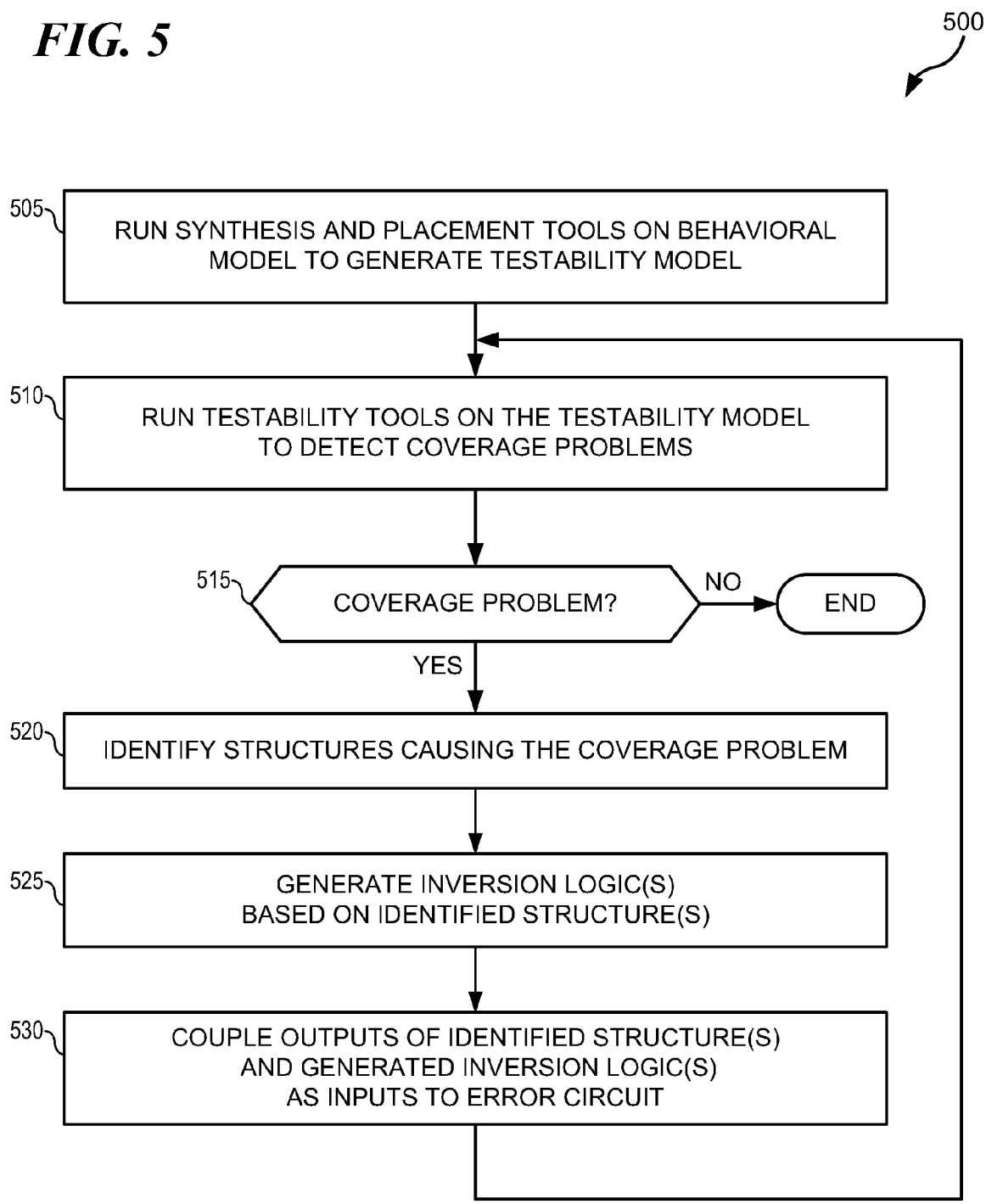
FIG. 5 illustrates a high-level flow diagram depicting logical operational steps of another circuit design method, which can be implemented in accordance with one embodiment of the disclosure.

FIG. 5 illustrates one embodiment of a method for circuit design optimization. Specifically, FIG. 5 illustrates a high-level flow chart 500 that depicts logical operational steps performed by, for example, system 300 of FIG. 3, which may be implemented in accordance with a preferred embodiment. Generally, design system 304 performs the steps of the method, unless indicated otherwise.

As indicated at block 405, the process begins, wherein the design engineer runs synthesis and placement tools on a behavioral model to generate a testability model. As described above, behavioral models, in some embodiments, are subject to numerous revisions in advance of synthesis and subsequent testing.

Next, as indicated at block 510, system 304 runs testability tools on the testability model to detect coverage problems. In one embodiment, the particular coverage problems detected is a function of user input. As such, in one embodiment, the design engineer can guide the testability tools toward coverage problems the design engineer knows are especially probable or are otherwise of interest to the design engineer.

Next, as indicated at decisional block 515, system 304 determines whether any coverage problems were identified. If at decisional block 515 no coverage problems were identified, the process continues along the NO branch, and the process ends. If at decisional block 515 one or more coverage problems were identified, the process continues along the YES branch to block 520.

Next, as indicated at block 520, system 304 identifies the logic structures causing the identified coverage problem(s). Next, as indicated at block 525, system 304 generates inversion logic(s) based on the identified logic structure(s).

Next, as indicated at block 530, system 304 couples the outputs of the identified structure(s) and the generated inversion logic(s) as inputs to the error circuit. The process returns to block 510, wherein system 304 re-runs the testability tool to identify additional coverage problems caused (or revealed) by the modifications to the testability model. As such, one skilled in the art will understand that system 304 may make several iterations before system 304 generates a testability model that does not include identified coverage problems.

Accordingly, the disclosed embodiments provide numerous advantages over other methods and systems. For example, some embodiments provide a significant improvement over traditional methods in that the disclosed embodiments allow a design engineer to automate the process of identifying and resolving coverage problems. As described above, the disclosed embodiments avoid cumbersome manual changes to the HDL representations of the design. Thus, the disclosed embodiments help reduce design cost and improve design process efficiency.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

One skilled in the art will appreciate that variations of the above-disclosed and other features and functions, or alternatives thereof, may be desirably combined into many other different systems or applications. Additionally, various presently unforeseen or unanticipated alternatives, modifications, variations or improvements therein may be subsequently made by those skilled in the art, which are also intended to be encompassed by the following claims.

What is claimed is:

1. A method, comprising:
   generating a first behavioral model of a circuit, the first behavioral model describing a physical circuit in a first configuration;
      wherein the first configuration comprises a first logic structure, the first logic structure configured to receive a first plurality of inputs, the first logic structure further configured to generate a first intermediate signal based on the first plurality of inputs;
   wherein the first configuration further comprises a logic cone configured to receive the first intermediate signal, to receive a plurality of scan inputs, and to generate a scan output based on the first intermediate signal and the plurality of scan inputs;
   modifying the first behavioral model to generate a second behavioral model, the second behavioral model describing the physical circuit in a second configuration;
      wherein the second configuration comprises an error circuit configured to receive the scan output and the first intermediate signal;
   generating a testability model based on the second behavioral model, the testability model comprising a first structural representation, based on the first logic structure;
   determining, based on the testability model, whether the first logic structure causes a first coverage problem; and
   in the event the first logic structure causes a first coverage problem, modifying the testability model to include an inversion structure;
      wherein the inversion structure is configured based on the first logic structure,
      wherein the inversion structure is configured to generate an inversion structure output; and
      modifying the testability model to couple the inversion structure output as an input to the error circuit, to generate a modified testability model.

2. The method of claim 1, wherein the inversion structure is configured to receive the first plurality of inputs and to generate the inversion structure output based on the first plurality of inputs.

3. The method of claim 1, further comprising determining whether the modified testability model includes a first additional logic structure causing a second coverage problem.

4. The method of claim 3, further comprising:
   in the event the first additional structure logic causes a second coverage problem,
      modifying the testability model to include a first additional inversion structure;
      wherein the first additional inversion structure is configured based on the first additional logic structure,
      wherein the first additional inversion structure is configured to generate a first additional inversion structure output; and
      modifying the testability model to couple the first additional inversion structure output as an input to the error circuit, to generate a second modified testability model.

5. The method of claim 1, wherein the first configuration further comprises a plurality of logic structures.

6. The method of claim 5, further comprising:
wherein the first configuration further comprises a second logic structure;
wherein the testability model further comprises a second structural representation, based on the second logic structure;
determining, based on the testability model, whether the second logic structure causes a second coverage problem; and
in the event the second logic structure causes a second coverage problem,
modifying the testability model to include an additional inversion structure;
wherein the additional inversion structure is configured based on the second logic structure,
wherein the additional inversion structure is configured to generate an additional inversion structure output; and
modifying the testability model to couple the additional inversion structure output as an input to the error circuit, to generate a modified testability model.

7. The method of claim 1, wherein determining whether the first logic structure causes a coverage problem comprises application of a testability tool to the testability model.

8. The method of claim 1, further comprising performing design for test (DFT) testing on the modified testability model to identify faults based on an output of the error circuit.

9. A computer program product for circuit design, the computer program product comprising:
a non-transitory computer readable storage medium having computer readable program code embodied therewith, the computer readable program code comprising:
computer readable program code configured to generate a first behavioral model of a circuit, the first behavioral model describing a physical circuit in a first configuration;
wherein the first configuration comprises a first logic structure, the first logic structure configured to receive a first plurality of inputs, the first logic structure further configured to generate a first intermediate signal based on the first plurality of inputs;
wherein the first configuration further comprises a logic cone configured to receive the first intermediate signal, to receive a plurality of scan inputs, and to generate a scan output based on the first intermediate signal and the plurality of scan inputs;
computer readable program code configured to modify the first behavioral model to generate a second behavioral model, the second behavioral model describing the physical circuit in a second configuration;
wherein the second configuration comprises an error circuit configured to receive the scan output and the first intermediate signal;
computer readable program code configured to generate a testability model based on the second behavioral model, the testability model comprising a first structural representation, based on the first logic structure;
computer readable program code configured to determine, based on the testability model, whether the first logic structure causes a first coverage problem; and
computer readable program code configured to, in the event the first logic structure causes a first coverage problem,
modify the testability model to include an inversion structure;
wherein the inversion structure is configured based on the first logic structure,
wherein the inversion structure is configured to generate an inversion structure output; and
modify the testability model to couple the inversion structure output as an input to the error circuit, to generate a modified testability model.

10. The computer program product of claim 9, wherein the inversion structure is configured to receive the first plurality of inputs and to generate the inversion structure output based on the first plurality of inputs.

11. The computer program product of claim 9, further comprising computer readable program code configured to determine whether the modified testability model includes a first additional logic structure causing a second coverage problem.

12. The computer program product of claim 11, further comprising:
computer readable program code configured to, in the event the first additional structure logic causes a second coverage problem,
modify the testability model to include a first additional inversion structure;
wherein the first additional inversion structure is configured based on the first additional logic structure,
wherein the first additional inversion structure is configured to generate a first additional inversion structure output; and
modify the testability model to couple the first additional inversion structure output as an input to the error circuit, to generate a second modified testability model.

13. The computer program product of claim 9, wherein the first configuration further comprises a plurality of logic structures.

14. The computer program product of claim 13, further comprising:
wherein the first configuration further comprises a second logic structure;
wherein the testability model further comprises a second structural representation, based on the second logic structure;
computer readable program code configured to determine, based on the testability model, whether the second logic structure causes a second coverage problem; and
computer readable program code configured to, in the event the second logic structure causes a second coverage problem,
modify the testability model to include an additional inversion structure;
wherein the additional inversion structure is configured based on the second logic structure,
wherein the additional inversion structure is configured to generate an additional inversion structure output; and
modify the testability model to couple the additional inversion structure output as an input to the error circuit, to generate a modified testability model.

15. The computer program product of claim 9, wherein determining whether the first logic structure causes a coverage problem comprises application of a testability tool to the testability model.

16. The computer program product of claim 9, further comprising computer readable program code configured to perform design for test (DFT) testing on the modified testability model to identify faults based on an output of the error circuit.

17. A system, comprising:
a user interface configured to receive user input from a user;
a generation module configured to generate a first behavioral model of a circuit,
 based on received user input, the first behavioral model describing a physical circuit in a first configuration;
 wherein the first configuration comprises a first logic structure, the first logic structure configured to receive a first plurality of inputs, the first logic structure further configured to generate a first intermediate signal based on the first plurality of inputs;
 wherein the first configuration further comprises a logic cone configured to receive the first intermediate signal, to receive a plurality of scan inputs, and to generate a scan output based on the first intermediate signal and the plurality of scan inputs;
a module editor configured to modify the first behavioral model to generate a second behavioral model, the second behavioral model describing the physical circuit in a second configuration;
 wherein the second configuration comprises an error circuit configured to receive the scan output and the first intermediate signal;
a synthesis module configured to generate a testability model based on the second behavioral model, the testability model comprising a first structural representation, based on the first logic structure; and
a hardware test module configured to determine, based on the testability model,
 whether the first logic structure causes a first coverage problem;
wherein the synthesis module is further configured to, in the event the first logic structure causes a first coverage problem:
 modify the testability model to include an inversion structure;
 wherein the inversion structure is configured based on the first logic structure,
 wherein the inversion structure is configured to generate an inversion structure output; and
 modify the testability model to couple the inversion structure output as an input to the error circuit, to generate a modified testability model.

18. The system of claim 17, wherein the inversion structure is configured to receive the first plurality of inputs and to generate the inversion structure output based on the first plurality of inputs.

19. The system of claim 17, wherein the test module is further configured to determine whether the modified testability model includes a first additional logic structure causing a second coverage problem.

20. The system of claim 19, further comprising:
wherein the synthesis module is further configured to, in the event the first
 additional structure logic causes a second coverage problem:
 modify the testability model to include a first additional inversion structure;
 wherein the first additional inversion structure is configured based on the first additional logic structure,
 wherein the first additional inversion structure is configured to generate a first additional inversion structure output; and
 modify the testability model to couple the first additional inversion structure output as an input to the error circuit, to generate a second modified testability model.

21. The system of claim 17, wherein the first configuration further comprises a plurality of logic structures.

22. The system of claim 21, further comprising:
wherein the first configuration further comprises a second logic structure;
wherein the testability model further comprises a second structural representation, based on the second logic structure;
wherein the test module is further configured to determine, based on the testability model, whether the second logic structure causes a second coverage problem; and
wherein the synthesis module is further configured to, in the event the second logic structure causes a second coverage problem:
 modify the testability model to include an additional inversion structure;
 wherein the additional inversion structure is configured based on the second logic structure,
 wherein the additional inversion structure is configured to generate an additional inversion structure output; and
 modify the testability model to couple the additional inversion structure output as an input to the error circuit, to generate a modified testability model.

23. The system of claim 17, wherein determining whether the first logic structure causes a coverage problem comprises application of a testability tool to the testability model.

24. The system of claim 17, wherein the test module is further configured to perform design for test (DFT) testing on the modified testability model to identify faults based on an output of the error circuit.

* * * * *